United States Patent
Saito et al.

(10) Patent No.: US 8,526,477 B2
(45) Date of Patent: Sep. 3, 2013

(54) SEMICONDUCTOR LIGHT EMITTING DEVICE

(75) Inventors: Shinji Saito, Tokyo (JP); Jongil Hwang, Tokyo (JP); Shinya Nunoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/034,329

(22) Filed: Feb. 24, 2011

(65) Prior Publication Data

US 2012/0032215 A1    Feb. 9, 2012

(30) Foreign Application Priority Data

Aug. 6, 2010   (JP) ................. 2010-177687

(51) Int. Cl.
*H01S 5/028* (2006.01)
*H01S 5/22* (2006.01)
*H01S 5/00* (2006.01)

(52) U.S. Cl.
USPC .............. 372/49.01; 372/43.01; 372/46.015

(58) Field of Classification Search
None
See application file for complete search history.

(56) References Cited

U.S. PATENT DOCUMENTS

| 7,315,559 B2 | 1/2008 | Dwilinski et al. | |
| 2002/0094003 A1* | 7/2002 | Bour et al. | 372/46 |
| 2008/0198886 A1* | 8/2008 | Michiue et al. | 372/44.011 |

FOREIGN PATENT DOCUMENTS

| JP | 2000-232254 A | 8/2000 |
| JP | 2003-60298 A | 2/2003 |
| JP | 2004-134555 | 4/2004 |
| JP | 2005-85852 A | 3/2005 |
| JP | 2008-186903 | 8/2008 |
| JP | 2009-170658 A | 7/2009 |
| JP | 4457549 | 2/2010 |
| WO | WO 2005/064661 A1 | 7/2005 |

OTHER PUBLICATIONS

McCluskey et al., "Metastability of Oxygen Donors in AlGaN", The Physical Review Letters, vol. 80, issue 18, pp. 4008-4011 (1998).*
Office Action issued Sep. 4, 2012 in Japanese Patent Application No. 2010-177687 with English language translation.
Office Action issued Apr. 9, 2013, in Japanese Patent Application No. 2010-177687, filed Aug. 6, 2010 (with Englishlanguage Translation).

* cited by examiner

*Primary Examiner* — Johannes P Mondt
(74) *Attorney, Agent, or Firm* — Oblon, Spivak, McClelland, Maier & Neustadt, L.L.P.

(57) ABSTRACT

A semiconductor light emitting device of one embodiment includes: a substrate; an n-type layer of an n-type nitride semiconductor on the substrate; an active layer of a nitride semiconductor on the n-type semiconductor layer; a p-type layer of a p-type nitride semiconductor on the active layer. The p-type layer has a ridge stripe shape. The device has an end-face layer of a nitride semiconductor formed on an end face of the n-type semiconductor layer, the active layer, and the p-type semiconductor layer. The end face is perpendicular to an extension direction of the ridge stripe shape. The end-face layer has band gap wider than the active layer. The end-face layer has Mg concentration in the range of 5E16 atoms/cm$^3$ to 5E17 atoms/cm$^3$ at a region adjacent to the p-type layer.

8 Claims, 9 Drawing Sheets

SEMICONDUCTOR LIGHT EMITTING DEVICE

CROSS-REFERENCE TO RELATED APPLICATION

This application is based upon and claims the benefit of priority from Japanese Patent Applications No. 2010-177687, filed on Aug. 6, 2010; the entire contents of which are incorporated herein by reference.

FIELD

Embodiments described herein relate generally to a semiconductor light emitting device.

BACKGROUND

A semiconductor laser diode (LD) using stimulated emission is used as a light source of a recording apparatus or the like. Lighting of high light flux can be obtained by using an LD of high output and a phosphor, and is being developed for realization.

An LD of high output has a problem such that the device deteriorates due to heat generation accompanying absorption of light near a light outgoing end face. There are also problems such that an operation failure due to current injection near an end face and the light emission efficiency deteriorates.

To realize a very reliable LD of high output, there is a method of forming a window structure of low light absorption of a material having a band gap wider than that of an active layer near a light outgoing end face of an active layer. In the case of a nitride semiconductor light emitting device made of a GaN-based material or the like, it cannot be always said that a window structure optimum to realize a very reliable LD of high output is presented.

DETAILED DESCRIPTION

A semiconductor light emitting device of one embodiment includes: a substrate; an n-type layer of an n-type nitride semiconductor on the substrate; an active layer of a nitride semiconductor on the n-type semiconductor layer; a p-type layer of a p-type nitride semiconductor on the active layer. The p-type layer has a ridge stripe shape. The device has an end-face layer of a nitride semiconductor formed on an end face of the n-type semiconductor layer, the active layer, and the p-type semiconductor layer. The end face is perpendicular to an extension direction of the ridge stripe shape. The end-face layer has band gap wider than the active layer. The end-face layer has Mg concentration in the range of 5E16 atoms/cm$^3$ to 5E17 atoms/cm$^3$ at a region adjacent to the p-type layer.

Embodiments will be described below with reference to the drawings.

First Embodiment

The semiconductor light emitting device of the embodiment has an end-face semiconductor layer (or end-face layer) of a nitride semiconductor whose band gap is wider than the active layer, thereby suppressing laser beam absorption in the device ends.

By introducing a proper amount of impurity such as Mg which forms a deep level in the end-face semiconductor layer, a high-resistance and low-absorption window structure is realized. Therefore, a high-output laser having high reliability is realized.

Figure 1A:
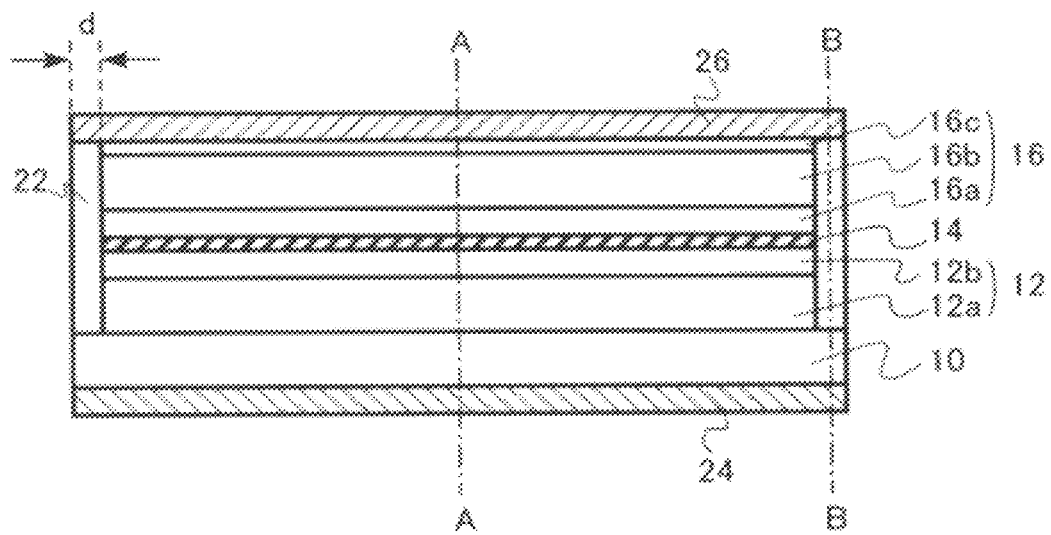
FIGS. 1A to 1C are schematic cross-sectional views of a semiconductor light emitting device of a first embodiment.
Figure 1B:
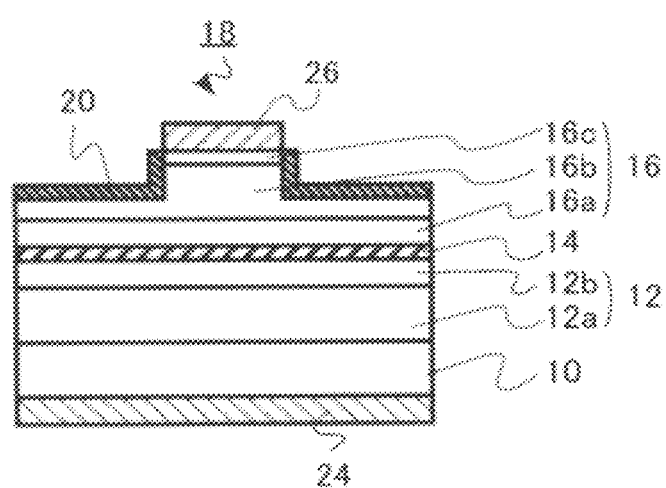
Figure 1C:
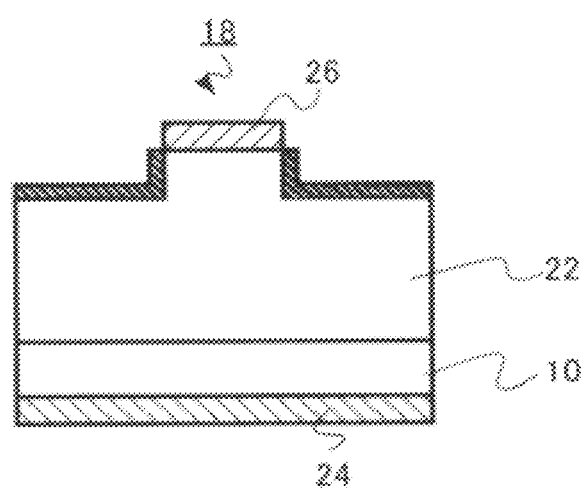

FIGS. 1A to 1C are cross-sectional views of a semiconductor light emitting device of the embodiment. FIG. 1A is a cross-sectional view parallel to the extension direction of the ridge stripe, FIG. 1B is a cross-sectional view taken along line A-A of FIG. 1A, and FIG. 1C is a cross-sectional view taken along line B-B of FIG. 1A.

In a semiconductor laser diode as the semiconductor light emitting device of the embodiment, as an n-type semiconductor layer (or n-type layer) 12 made of a GaN-based n-type nitride, for example, an n-type cladding layer 12a made of $Al_{0.05}Ga_{0.95}N$ which is Si-doped and has a thickness of 1200 nm and an n-type guide layer 12b which is Si-doped and has a thickness of 100 nm are formed on a substrate 10 of an n-type GaN (gallium nitride) semiconductor.

On the n-type semiconductor layer 12, for example, an active layer 14 having a multiquantum well structure of a GaN-based semiconductor having a multiquantum well (MQW) structure, for example, $In_{0.12}Ga_{0.88}N$ having a thickness of 3 nm/$In_{0.03}Ga_{0.97}N$ having a thickness of 10 nm is formed.

On the active layer 14, as a p-type semiconductor layer (or p-type layer) 16 of a GaN-based nitride semiconductor, for example, a p-type guide layer 16a which is Mg-doped and has a thickness of 100 nm, a p-type cladding layer 16b of p-type $Al_{0.05}Ga_{0.95}N$ which is Mg-doped and has a thickness of 600 nm, and a p-type contact layer 16c of p-type GaN which is Mg-doped and has a thickness of 10 nm is formed.

A not-shown overflow preventing layer made of, for example, p-type $Al_{0.2}Ga_{0.8}N$ which is Mg-doped and has a thickness of 10 nm may be formed between the p-type guide layer 16a and the p-type cladding layer 16b. The p-type guide layer 16a may be undoped.

The p-type semiconductor layer 16 has a ridge stripe (or a ridge stripe shape) 18. The ridge stripe 18 for forming a laser beam guide path region is formed at a top portion of the p-type semiconductor layer 16. The side faces of the ridge stripe 18 and the surface of the p-type cladding layer 16b are covered with, for example, an insulating film 20 which is a silicon oxide film. An end-face semiconductor layer 22 is formed on an end face of the n-type semiconductor layer 12, the active layer 14, and the p-type semiconductor layer 16, which is perpendicular to the extension direction of the rigid stripe 18.

The end-face semiconductor layer 22 is made of a GaN-based nitride semiconductor such as AlGaN having a band gap wider than the active layer 14. The concentration of Mg in a region formed in the end face of at least the p-type semiconductor layer 16, in the end-face semiconductor layer 22 is in the range of 5E16 atoms/cm$^3$ to 5E17 atoms/cm$^3$. The case where the concentration of Mg in the entire end-face semiconductor layer 22 is uniform will now be described.

An n-side electrode 24 is provided on the under face of the substrate 10, and a p-side electrode 26 is provided on the p-type contact layer 16c.

A reflection film made by a dielectric multilayer film may be formed on the end faces of the end-face semiconductor layer 22.

According to the embodiment, by providing the end-face nitride semiconductor layer 20 having a band gap wider than the active layer on the end face as a laser outgoing face, absorption near the end face of the laser beam caused by laser oscillation is suppressed. Therefore, destruction of the device caused by temperature rise near the end face is suppressed, and the reliability of the semiconductor laser diode improves.

Generally, it is difficult to reduce residual impurity and point defects in a GaN-based material. There is consequently the background concentration of n-type carrier which is about 1E16 atoms/cm$^3$. That is, the concentration is in the range of 5E15 atoms/cm$^3$ to 5E16 atoms/cm$^3$. Therefore, even when the end-face semiconductor layer 22 is made of a GaN-based material, due to development of then-type conduction, current flows in the end-face semiconductor layer 22 or the surface of the end part of the end-face semiconductor layer 22 from the p-side electrode toward the n-side electrode, and there is the possibility that an operation failure occurs or luminous efficiency decreases.

In the semiconductor laser diode of the embodiment, by introducing Mg as impurity in the range of 5E16 atoms/cm$^3$ to 5E17 atoms/cm$^3$, the resistance of the end-face semiconductor layer 22 is increased, so that an operation failure and decrease in the luminous efficiency caused by flow of excessive current can be suppressed. Mg has a deep acceptor level and very low activation rate, so that it is suitable as an impurity realizing high resistance. By introducing Mg as impurity, the level at which a laser beam is absorbed is obtained. However, since the acceptor level is deep, there is an advantage such that absorption of the laser beam does not easily occur.

When the impurity concentration becomes less than 5E16 atoms/cm$^3$, resistance does not become sufficiently high, and there is the possibility that an operation failure occurs. When the impurity concentration becomes higher than 5E17 atoms/cm$^3$, the absorption level becomes too high, the light emission inflection point at which the luminous amount is saturated with respect to current becomes too low, the luminous efficiency decreases, and an operation failure occurs. It is undesirable.

In the embodiment, it is desirable from the viewpoint of improvement in reliability that the thickness ("d" in FIG. 1A) in the extension direction of the ridge stripe of the end-face semiconductor layer 22 is 10 µm or larger. More desirably, the thickness is larger than 10 µm and, further, more desirably, the thickness is equal to or larger than 20 µm. Since the length of a resonator of the device is about hundreds µm, the thickness is desirably 50 µm or less so that the percentage of a gain region in the entire device does not become low.

In the embodiment, the end-face semiconductor layer 22 in which no current flows due to high resistance does not have a guiding structure, so that light expands and density of light passing through the end face decreases. There is consequently also an advantage that adhesion of a foreign matter due to photochemical reaction does not occur near the end face.

Next, a method of manufacturing the semiconductor light emitting device of the embodiment will be described. FIGS. 2A to 6B are process sectional views showing a method of manufacturing the semiconductor light emitting device of the embodiment. FIGS. 2A, 3A, 4A, 5A, and 6A are cross-sectional views parallel to the extension direction of the ridge stripe, and FIGS. 2B, 3B, 4B, 5B, and 6B are cross-sectional views taken along line A-A of FIGS. 2A, 3A, 4A, 5A, and 6A, respectively.

Figure 2A:
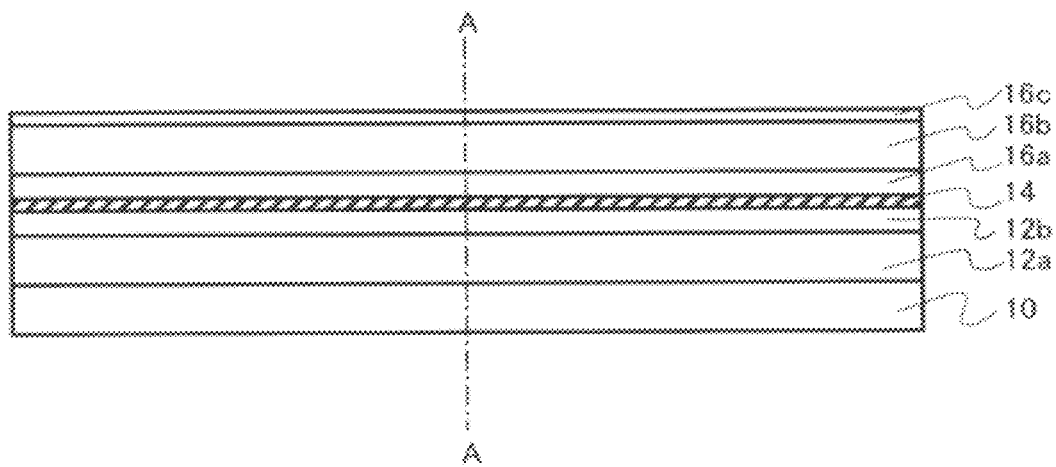
FIGS. 2A and 2B are process sectional views showing a method of manufacturing the semiconductor light emitting device of the first embodiment.
Figure 2B:
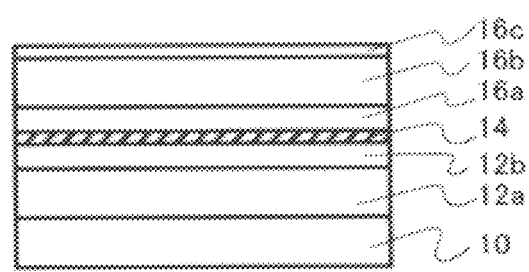

On the n-type GaN substrate 10, by MOCVD, the n-type cladding layer 12a of $Al_{0.05}Ga_{0.95}N$, the n-type guide layer 12b of GaN, the active layer 14 having the multiple structure of $In_{0.12}Ga_{0.88}N/In_{0.03}Ga_{0.97}N$, the p-type guide layer 16a of GaN, the p-type cladding layer 16b of $Al_{0.05}Ga_{0.95}N$, and the p-type contact layer 16c of GaN are sequentially formed (FIGS. 2A and 2B).

Figure 3A:
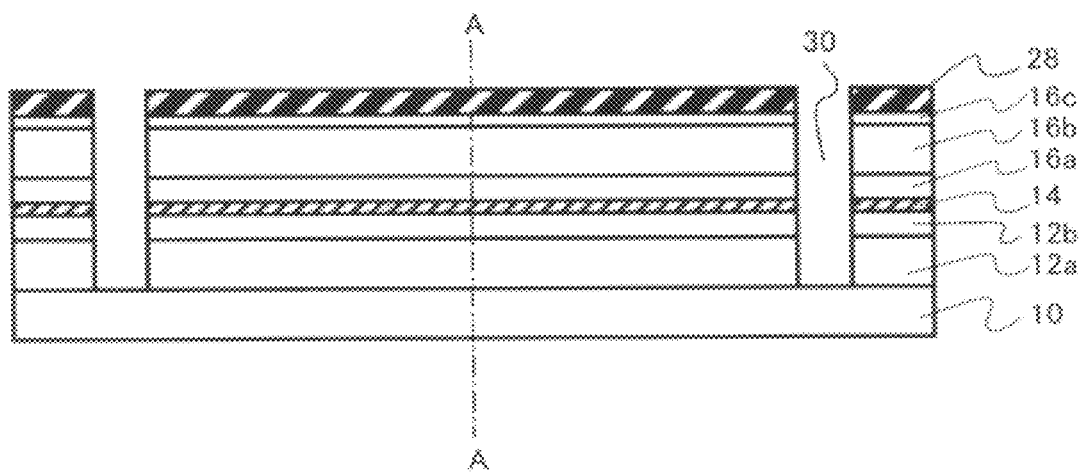
FIGS. 3A and 3B are process sectional views showing a method of manufacturing the semiconductor light emitting device of the first embodiment.
Figure 3B:
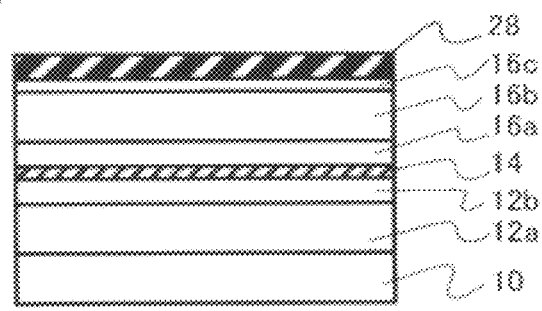

Next, a $SiO_2$ film 28 is deposited on the top face of the p-type contact layer 16c. By patterning using a resist and etching with ammonium fluoride, a mask for forming the end-face semiconductor layer is formed. By a dry etching apparatus, etching is performed until the n-type cladding layer 12a is removed by using the mask, a trench 30 is formed (FIGS. 3A and 3B).

Figure 4A:
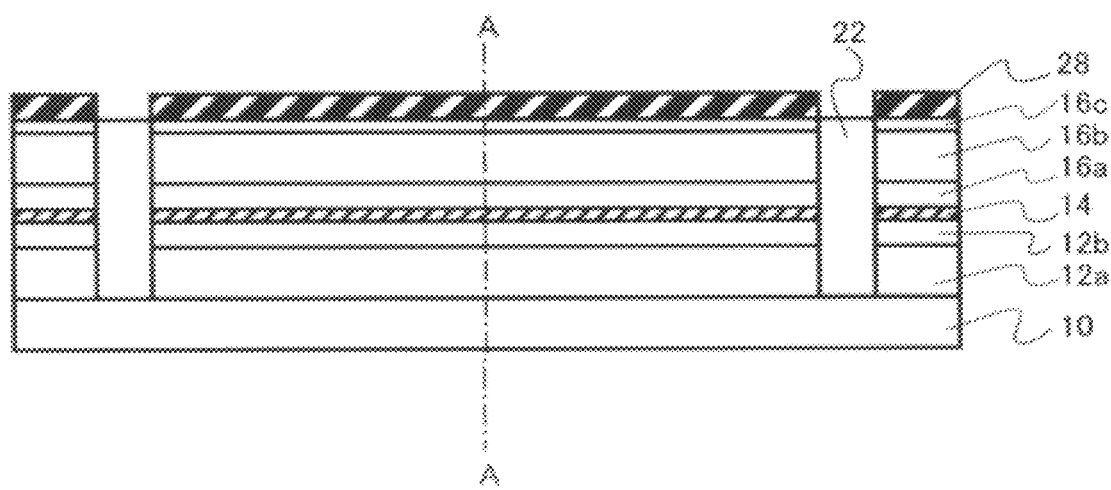
FIGS. 4A and 4B are process sectional views showing a method of manufacturing the semiconductor light emitting device of the first embodiment.
Figure 4B:
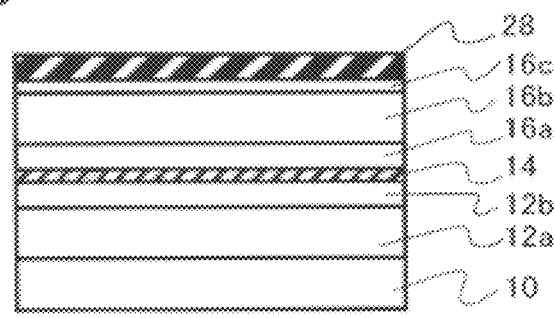

While leaving the $SiO_2$ film 28, the trench 30 is buried with AlGaN of single crystal in which Mg is doped by the MOCVD, thereby forming the end-face semiconductor layer 22 (FIGS. 4A and 4B).

AlGaN is formed in a polycrystal state also on the $SiO_2$ film 28. Consequently, to remove AlGaN on the $SiO_2$ film 28, the $SiO_2$ film 28 is etched with HF and, after that, dried. The device is immersed in water. After that, temperature is increased sharply, and AlGaN is destroyed and removed by expansion of air bubbles.

In this case, to prevent the p-type contact layer 16c under the $SiO_2$ film 28 from being excessively damaged, desirably, the $SiO_2$ film 28 is not etched at once. AlGaN is removed in a state where the $SiO_2$ film 28 remains slightly on the surface. After that, the remained $SiO_2$ film 28 is etched.

Next, a $SiO_2$ film is deposited on the top face of the p-type contact layer 16c and the buried end-face semiconductor layer 22. To form a ridge stripe by patterning using a resist and etching with ammonium fluoride, a mask having a width of about 10 µm is formed. By a dry etching apparatus, etching is performed to some midpoint in the p-type cladding layer 16b of $Al_{0.05}Ga_{0.95}N$ with the mask, thereby forming the ridge stripe 18.

Figure 5A:
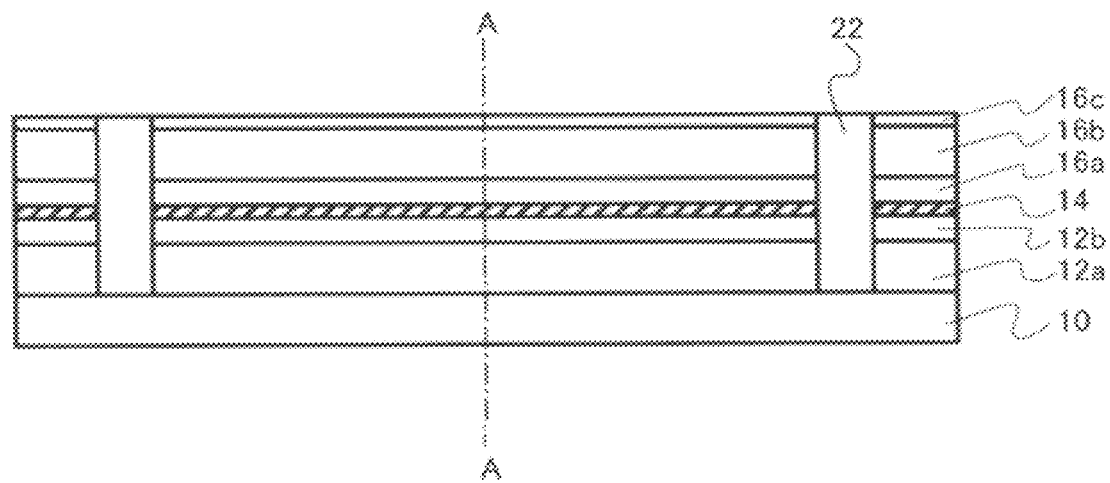
FIGS. 5A and 5B are process sectional views showing a method of manufacturing the semiconductor light emitting device of the first embodiment.
Figure 5B:
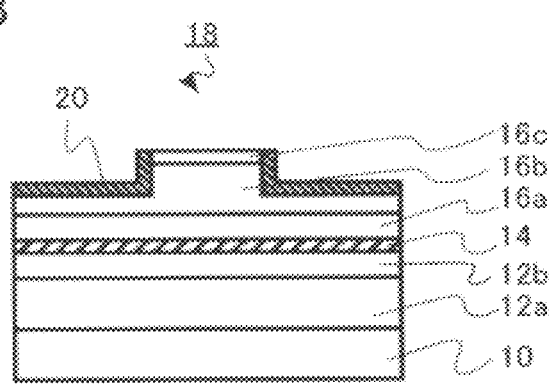

After removal of the mask, for example, by deposition of an $SiO_2$ film and patterning using a resist, the insulating film 20 is formed on the side faces of the ridge stripe 18 and the surface of the p-type cladding layer 16b (FIGS. 5A and 5B).

Figure 6A:
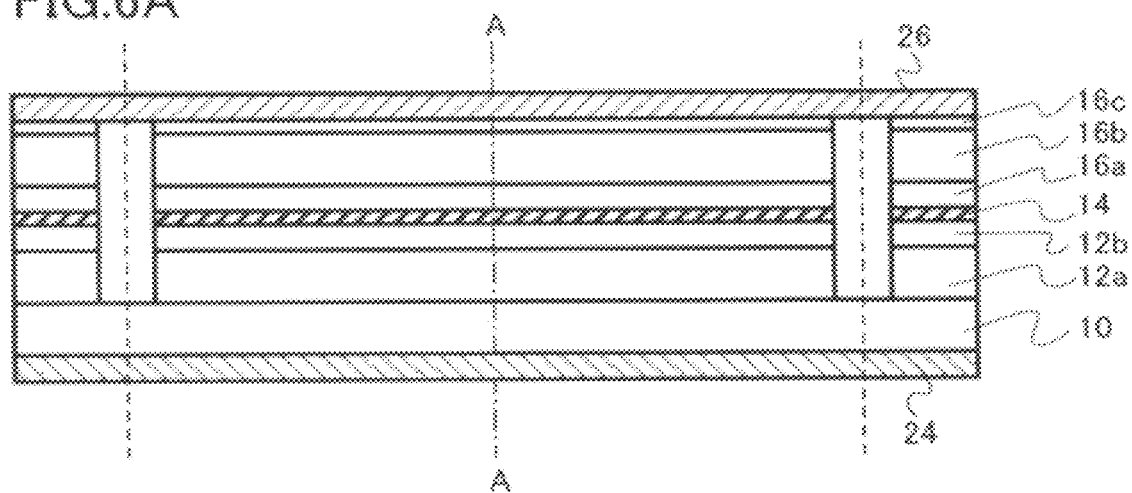
FIGS. 6A and 6B are process sectional views showing a method of manufacturing the semiconductor light emitting device of the first embodiment.
Figure 6B:
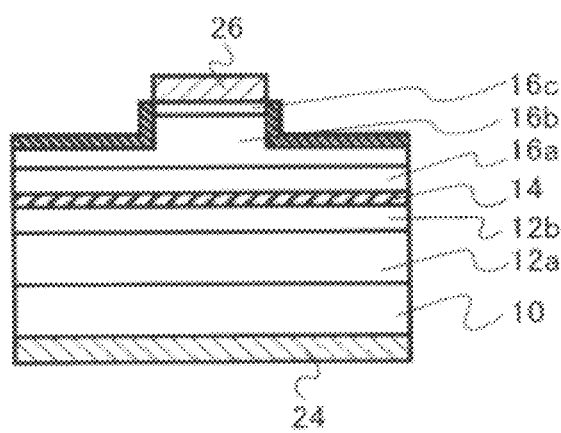

After that, an electrode metal for a p-side electrode is deposited and patterned, thereby forming a p-side electrode 26. Further, the GaN substrate 10 on the side opposite to the ridge stripe 18 is thinned by polishing. After that, an electrode metal for an n-side electrode is deposited and patterned, thereby forming an n-side electrode 24 (FIGS. 6A and 6B).

In the surface of the n-type GaN substrate 10, a scribing line is formed in a cleavage direction orthogonal to the ridge stripe. Using the scribing line as a start point, the n-type GaN substrate 10 is cut into bars in the position shown by the broken line in FIG. 6A along the cleavage face so that the end-face semiconductor layer 22 becomes the end face.

Further, by performing scribing and braking on the bar-shaped n-type GaN substrate in the short-side direction, one semiconductor light emitting device as shown in FIGS. 1A to 1C is manufactured. For example, the width in the short-side direction of the semiconductor light emitting device (length in the direction orthogonal to the extension direction of the ridge stripe) is set to 100 µm.

Figure 7A:
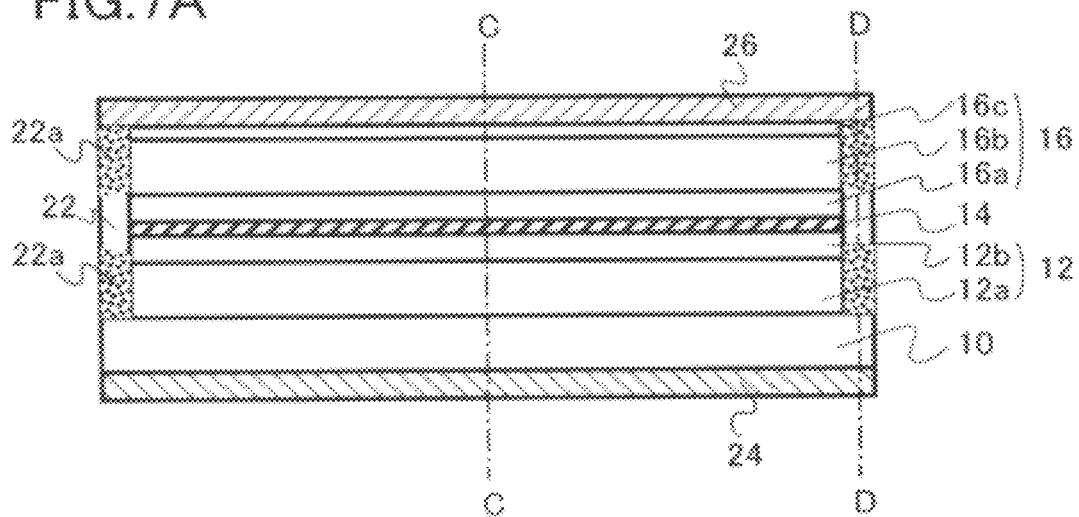
FIGS. 7A to 7C are cross-sectional views of a modification of the semiconductor light emitting device of the first embodiment.
Figure 7B:
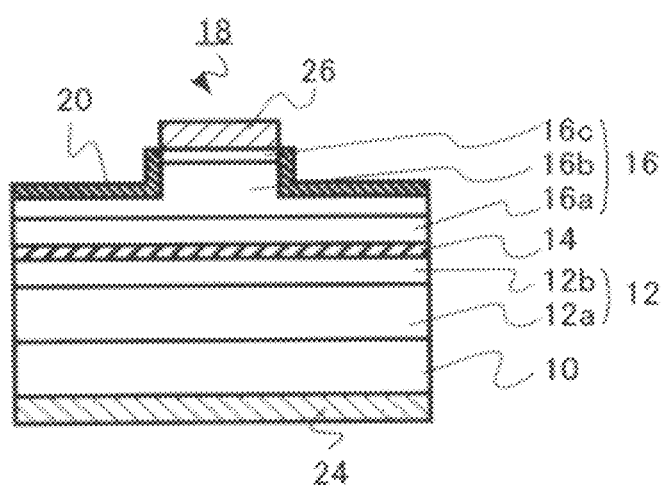
Figure 7C:
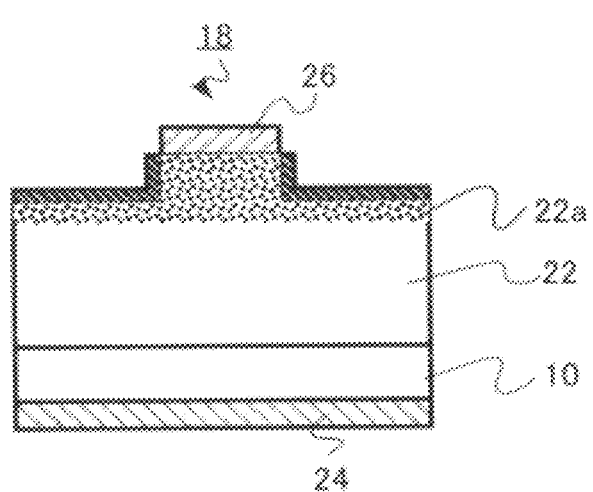

FIGS. 7A to 7C are cross-sectional views of a modification of the semiconductor light emitting device of the embodiment. FIG. 7A is a cross-sectional view parallel to the extension direction of the ridge stripe, FIG. 7B is a cross-sectional view taken along line C-C of FIG. 7A, and FIG. 7C is a cross-sectional view taken along line D-D of FIG. 7A.

The modification is different from the foregoing embodiment with respect to the point that, although concentration of Mg in the entire end-face semiconductor layer 22 is uniform in the embodiment, the concentration of Mg in a region formed in the end face of the p-type semiconductor layer is in the range of 5E16 atoms/cm$^3$ to 5E17 atoms/cm$^3$.

As shown in FIGS. 7A and 7C, there is an Mg concentration distribution in the end-face semiconductor layer 22. The impurity concentration in a region 22a formed in the end face of the p-type semiconductor layer 16 and the n-type semiconductor layer 12 is higher than that in the other region. In the region 22a, the concentration of Mg satisfies the condition of the range of 5E16 atoms/cm$^3$ to 5E17 atoms/cm$^3$.

Also in the modification, the resistance of the end-face semiconductor layer 22 is increased, so that an operation failure caused by flow of excessive current can be suppressed.

The semiconductor light emitting device of the modification can be manufactured by controlling impurity concentration of a reaction gas at the time of burying the trench 30 with the end-face semiconductor layer by the MOCVD.

Second Embodiment

A semiconductor light emitting device of a second embodiment is similar to that of the first embodiment except that the end-face semiconductor layer has a layer-stack structure made of a first low-refractive-index layer, a high-refractive-index layer, and a second low-refractive-index layer from the GaN substrate side, and a region formed in the end face of the active layer, in the end-face semiconductor layer is the high-refractive-index layer. Therefore, the contents overlapping with the first embodiment will not be repeated.

Figure 8A:
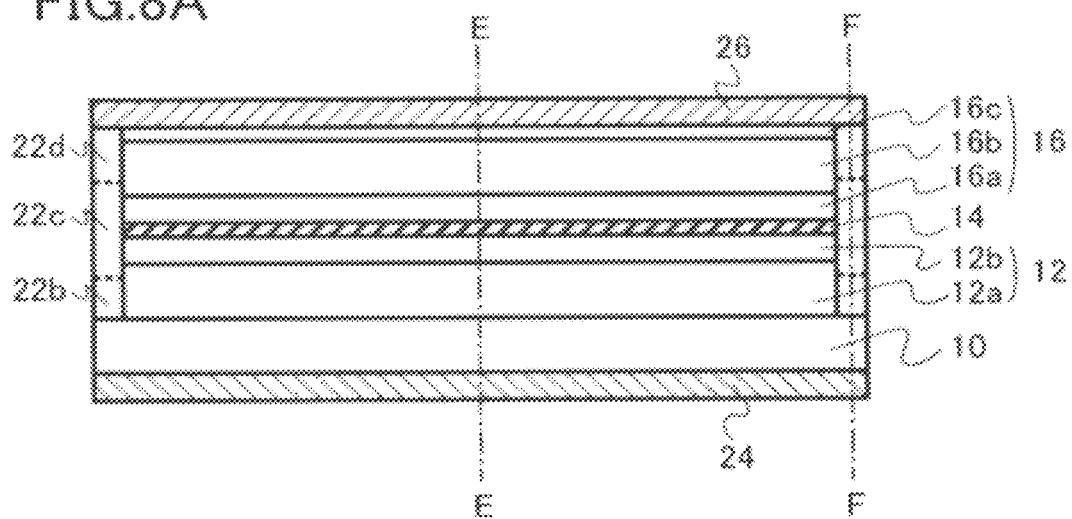
FIGS. 8A to 8C are cross-sectional views of a semiconductor light emitting device of a second embodiment.
Figure 8B:
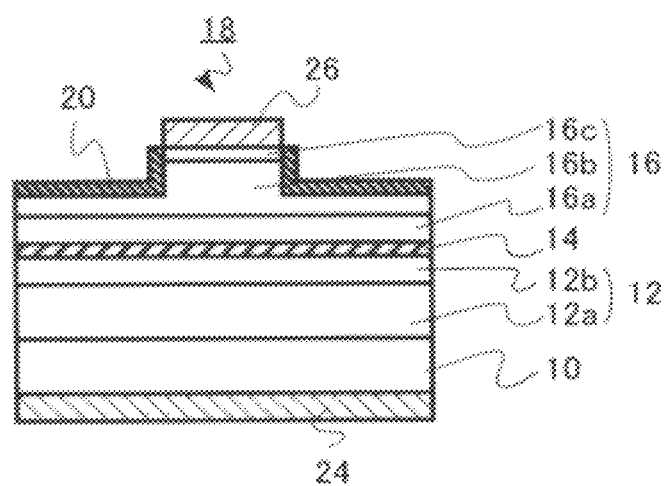
Figure 8C:
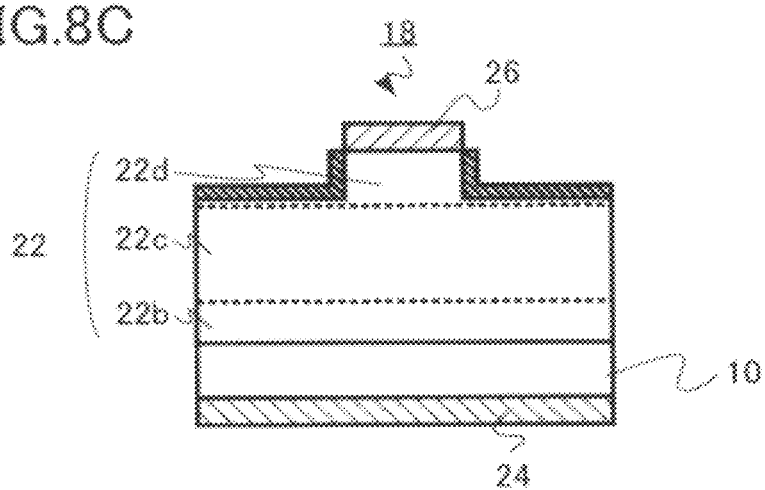

FIGS. 8A to 8C are cross-sectional views of a semiconductor light emitting device of the embodiment. FIG. 8A is a cross-sectional view parallel to the extension direction of the ridge stripe, FIG. 8B is a cross-sectional view taken along line E-E of FIG. 8A, and FIG. 8C is a cross-sectional view taken along line F-F of FIG. 8A.

As shown in FIGS. 8A and 8C, the end-face semiconductor layer 22 has a layer-stack structure made of a first low-refractive-index layer 22b, a high-refractive-index layer 22c, and a second low-refractive-index layer 22d from the GaN substrate 10 side. A region formed in the end face of the active layer 14 is made by the high-refractive-index layer 22c.

The thickness of the high-refractive-index layer 22c is larger than total thickness of the n-type guide layer 12b, the active layer 14, and the p-type guide layer 16a. The upper end of the high-refractive-index layer 22c is positioned higher than the upper end of the p-type guide layer 16a, and the lower end of the high-refractive-index layer 22c is positioned lower than the lower end of the n-type guide layer 12b.

The active layer 14 has a multiquantum well structure (MQW) of $In_XGa_{1-X}N$ (0<X<1). For example, the first and second low-refractive-index layers 22b and 22d are made of single-crystal $Al_YGa_{1-Y}N$ (0<Y<1), and the high-refractive-index layer 22c is made of, for example, single-crystal GaN.

The refractive index of a GaN-based semiconductor decreases when concentration of Al increases. Consequently, it is desirable that concentration of Al in the first low-refractive-index layer and the second low-refractive-index layer is higher than that of Al in the high-refractive-index layer.

According to the embodiment, a laser beam emitted from the active layer 14 to the end-face semiconductor layer 22 side is guided by the interface between the high-refractive-index layer 22c and the first and second low-refractive-index layers 22b and 22d. Therefore, the laser beam emitted is guided without expanding, and there is an advantage such that drop in the reflectance in the end face can be avoided.

The form that the upper end of the high-refractive-index layer 22c is positioned higher than the upper end of the p-type guide layer 16a, and the lower end of the high-refractive-index layer 22c is positioned lower than the lower end of the n-type guide layer 12b as shown in FIG. 8A is desirable for the reason that a laser beam emitted from the active layer 14 and passed through the p-type guide layer 16a or the n-type guide layer 12b is not scattered by the interface. However, with at least the configuration that the upper end of the high-refractive-index layer 22c is positioned higher than the upper end of the active layer 14, and the lower end of the high-refractive-index layer 22c is positioned lower than the lower end of the active layer 14, a laser beam emitted is guided without expanding, and drop in the reflectance in the end face can be avoided.

The semiconductor light emitting device of the modification can be manufactured by controlling the composition of a reaction gas at the time of burying the trench 30 with the end-face semiconductor layer by the MOCVD.

Third Embodiment

A semiconductor light emitting device of a third embodiment is different from the first embodiment with respect to the point that a ridge stripe shape is formed simultaneously with the trench in the end-face semiconductor layer, and side faces of the ridge stripe are buried by the same material as that of the end-face semiconductor layer. In the following, the contents overlapping with the first embodiment will not be repeated.

Figure 9A:
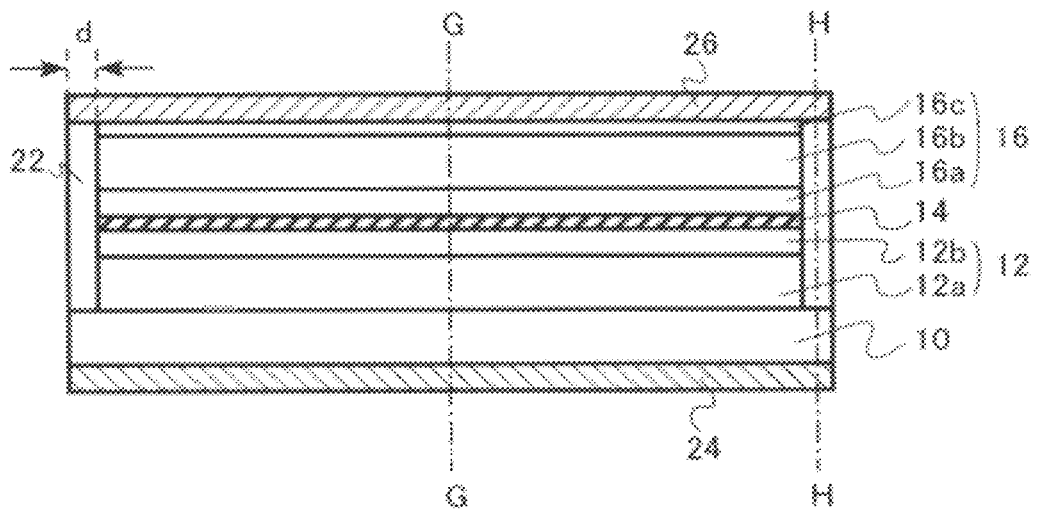
FIGS. 9A to 9C are cross-sectional views of a semiconductor light emitting device of a third embodiment.
Figure 9B:
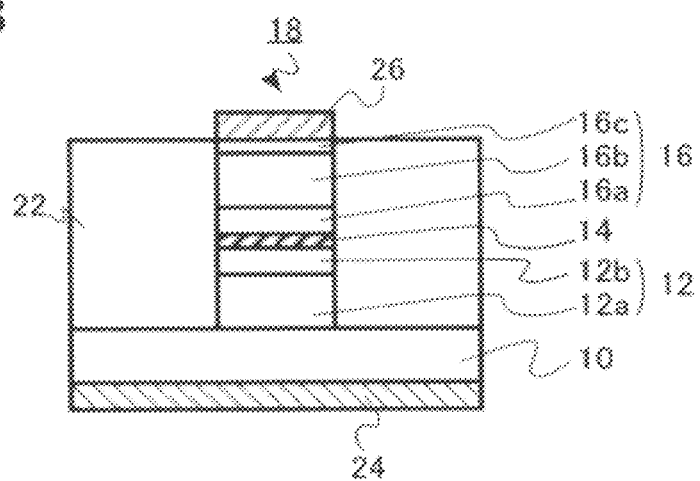
Figure 9C:
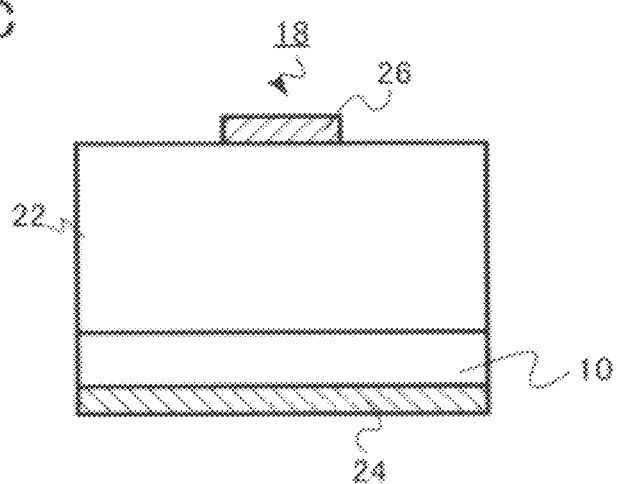

FIGS. 9A to 9C are cross-sectional views of a semiconductor light emitting device of the embodiment. FIG. 9A is a cross-sectional view parallel to the extension direction of the ridge stripe, FIG. 9B is a cross-sectional view taken along line G-G of FIG. 9A, and FIG. 9C is a cross-sectional view taken along line H-H of FIG. 9A.

As shown in FIG. 9B, side faces of the ridge stripe 18 are also buried with the same material as, for example, that of the end-face semiconductor layer 22 of AlGaN.

The semiconductor light emitting device of the embodiment can be manufactured by performing etching of the ridge stripe 18 and etching of a region for forming the end-face semiconductor layer 22 by using the same mask.

The third embodiment has, in addition to the effect of the first embodiment, an advantage that the manufacturing process is easier and reduction in manufacture cost can be realized.

While certain embodiments have been described, these embodiments have been presented by way of example only, and are not intended to limit the scope of the inventions. Indeed, the semiconductor light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Example

An example will be described below.

A semiconductor laser diode similar to that described in the third embodiment was formed. At the time of formation, on a substrate of an n-type GaN (gallium nitride) semiconductor, an n-type cladding layer of n-type $Al_{0.05}Ga_{0.95}N$ having a thickness of 1200 nm and Si-doped and an n-type guide layer of n-type GaN having a thickness of 100 nm and Si-doped were formed as GaN-based n-type semiconductor layers.

On the n-type semiconductor layer, an active layer having a multiple structure of a GaN-based semiconductor having a multiquantum well (MQW) structure, $In_{0.12}Ga_{0.88}N$ having a thickness of 3 nm/$In_{0.03}Ga_{0.97}N$ having a thickness of 10 nm was formed.

On the active layer, as a p-type semiconductor layer of a GaN-based material, an undoped GaN guide layer having a thickness of 100 nm, a p-type overflow preventing layer of p-type $Al_{0.2}Ga_{0.8}N$ having a thickness of 10 nm and Mg-doped, a p-type cladding layer of p-type $Al_{0.05}Ga_{0.95}N$ which is Mg-doped and has a thickness of 600 nm, and a p-type contact layer of p-type GaN which is Mg-doped and has a thickness of 10 nm were formed.

The ridge stripe structure and the trench region for forming the end-face semiconductor layer were etched simultaneously using the same mask until there is not n-type cladding layer. After that, by MOCVD, the side faces of the ridge stripe and the trench region were buried with Mg-doped single-crystal AlGaN, thereby simultaneously forming the buried layer on the side faces of the ridge stripe and the end-face semiconductor layer.

After that, an n-side electrode and a p-side electrode were formed and cleavage was performed, thereby manufacturing a semiconductor laser diode.

Semiconductor laser diodes obtained by changing Mg impurity concentration in the end-face semiconductor layer were manufactured, and threshold current at which laser oscillation starts and the light output inflection point were evaluated. Table 1 shows the result.

TABLE 1

| | Impurity concentration (atoms/cm³) | | | | |
|---|---|---|---|---|---|
| | 1E16 | 5E16 | 1E17 | 5E17 | 1E18 |
| Threshold current | No oscillation | 100 mA | 100 mA | 500 mA | No oscillation |
| Light output inflection point | — | 3 A | 3.5 A | 1.5 A | — |

Excellent characteristics were obtained when the impurity concentration is in the range of 5E16 atoms/cm³ and 5E17 atoms/cm³, particularly, equal to or less than 1E17 atoms/cm³. In the case of 1E16 atoms/cm³, n-type conduction remained. Consequently, current flowing in the end-face semiconductor layer was generated, and no oscillation occurred. In the case of 1E18 atoms/cm³, it is considered that p-type conduction developed so that no oscillation occurred.

Semiconductor laser diodes obtained by changing the thickness (d in FIG. 9A) in the extension direction of the ridge stripe of the end-face semiconductor layer were manufactured, and driven for 1000 hours by light output of 3 W. After that, light outputs in which sudden deterioration occurs were measured to evaluate reliability. Table 2 shows the result.

TABLE 2

| | Width d (μm) | | | |
|---|---|---|---|---|
| | 5 | 10 | 20 | 30 |
| Light output in which sudden deterioration occurs | 3.3 W | 5 W | 5.5 W | 5.5 W |

Excellent characteristics were obtained when the thickness "d" is 10 μm or larger, particularly, 20 μm or larger. It is presumed that the reason why reliability improves when the thickness in the extension direction of the ridge stripe of the end-face semiconductor layer increases is heat dissipation from the end-face semiconductor layer contributes.

What is claimed is:

1. A semiconductor laser diode comprising:
   a substrate;
   an n-type layer of an n-type nitride semiconductor on the substrate;
   an active layer of a nitride semiconductor on the n-type layer;
   a p-type layer of a p-type nitride semiconductor on the active layer, the p-type layer having a ridge stripe shape; and
   an end-face layer of a nitride semiconductor formed on an end face of the n-type layer, the active layer, and the p-type layer, the end face being perpendicular to an extension direction of the ridge stripe shape, the end-face layer having a band gap wider than the active layer, the end-face layer having Mg (Magnesium) concentration in the range of $5 \times 10^{16}$ atoms/cm³ to $5 \times 10^{17}$ atoms/cm³ at a region adjacent to the p-type layer,
   wherein a thickness of the end-face layer in the extension direction of the ridge stripe shape is 10 μm or larger.

2. The semiconductor laser diode according to claim 1, wherein the end-face layer has a layer-stack structure made of a first low-refractive-index layer, a high-refractive-index layer, and a second low-refractive-index layer from the substrate side, the high-refractive-index layer being formed adjacent to the active layer.

3. The device according to claim 2, wherein a concentration of Al (Aluminum) in the first low-refractive-index layer and the second low-refractive-index layer is higher than that in the high-refractive-index layer.

4. The device according to claim 3, wherein the active layer is made of $In_XGa_{1-X}N$ (0<X<1), the first and second low-refractive-index layers are made of $Al_YGa_{1-Y}N$ (0<Y<1), and the high-refractive-index layer is made of GaN.

5. A semiconductor laser diode comprising:
   a substrate;
   an n-type layer of an n-type nitride semiconductor on the substrate;
   an active layer of a nitride semiconductor on the n-type layer;
   a p-type layer of a p-type nitride semiconductor on the active layer, the p-type layer having a ridge stripe shape; and
   an end-face layer of a nitride semiconductor formed on an end face of the n-type layer, the active layer, and the p-type layer, the end face being perpendicular to an extension direction of the ridge stripe shape, the end-face layer having a band gap wider than the active layer, the end-face layer having Mg (Magnesium) concentration in the range of $5\times10^{16}$ atoms/cm$^3$ to $5\times10^{17}$ atoms/cm$^3$ at a region adjacent to the p-type layer, wherein a thickness of the end-face layer in the extension direction of the ridge stripe shape is 20 μm or larger.

6. A semiconductor laser diode comprising:

a substrate;

an n-type layer of an n-type nitride semiconductor on the substrate;

an active layer of a nitride semiconductor on the n-type layer;

a p-type layer of a p-type nitride semiconductor on the active layer, the p-type layer having a ridge stripe shape; and an end-face layer of a nitride semiconductor formed on an end face of the n-type layer, the active layer, and the p-type layer, the end face being perpendicular to an extension direction of the ridge stripe shape, the end-face layer having a band gap wider than the active layer, the end-face layer having Mg (Magnesium) concentration in the range of $5\times10^{16}$ atoms/cm$^3$ to $5\times10^{17}$ atoms/cm$^3$ at a region adjacent to the p-type layer, wherein the end-face layer has a layer-stack structure made of a first low-refractive-index layer, a high-refractive-index layer, and a second low-refractive-index layer from the substrate side, the high-refractive-index layer being formed adjacent to the active layer, and a thickness of the end-face layer in the extension direction of the ridge stripe shape is 20 μm or larger.

7. The device according to claim 6, wherein a concentration of Al (Aluminum) in the first low-refractive-index layer and the second low-refractive-index layer is higher than that of Al in the high-refractive-index layer.

8. The device according to claim 7, wherein the active layer is made of In$_X$Ga$_{1-X}$N (0<X<1), the first and second low-refractive-index layers are made of Al$_Y$Ga$_{1-Y}$N (0<Y<1), and the high-refractive-index layer is made of GaN.

* * * * *